United States Patent [19]
Karrasch et al.

[11] Patent Number: 5,855,294
[45] Date of Patent: Jan. 5, 1999

[54] FEED RELEASE MECHANISM FOR A TERMINAL INSERTION MACHINE

[75] Inventors: Christopher John Karrasch, Boiling Springs; Michael Herbert Cairns, Elizabethtown, both of Pa.

[73] Assignee: The Whitaker Corporation, Wilmington, Del.

[21] Appl. No.: 979,648

[22] Filed: Nov. 26, 1997

[51] Int. Cl.⁶ .................................................. B65G 59/00
[52] U.S. Cl. ........................................... 221/268; 221/289
[58] Field of Search ................................ 221/200, 208, 221/268, 270, 272, 276, 289, 258

[56] References Cited

U.S. PATENT DOCUMENTS 5,069,362 12/1991 Albright ................................... 221/268
5,415,318 5/1995 Lewis ...................................... 221/268

*Primary Examiner*—Kenneth Noland

[57] ABSTRACT

A terminal insertion machine (10) includes a feed unit (14) for feeding a strip (16) of terminals into a workstation (12) for inserting a terminal into a housing. The feed unit (14) includes a feed finger (56) for intermittently feeding the strip and an anti-backup finger (84) for preventing movement of the strip while the feed finger (56) is retracted preparatory to feeding the next terminal. A single release member (100) is arranged to pivot into first, second, and third positions (140, 142, 144) for moving the feed and anti-backup fingers into and out of engagement with the strip of terminals when loading the strip, when operating the insertion machine, and when removing the strip from the insertion machine, respectively.

11 Claims, 6 Drawing Sheets

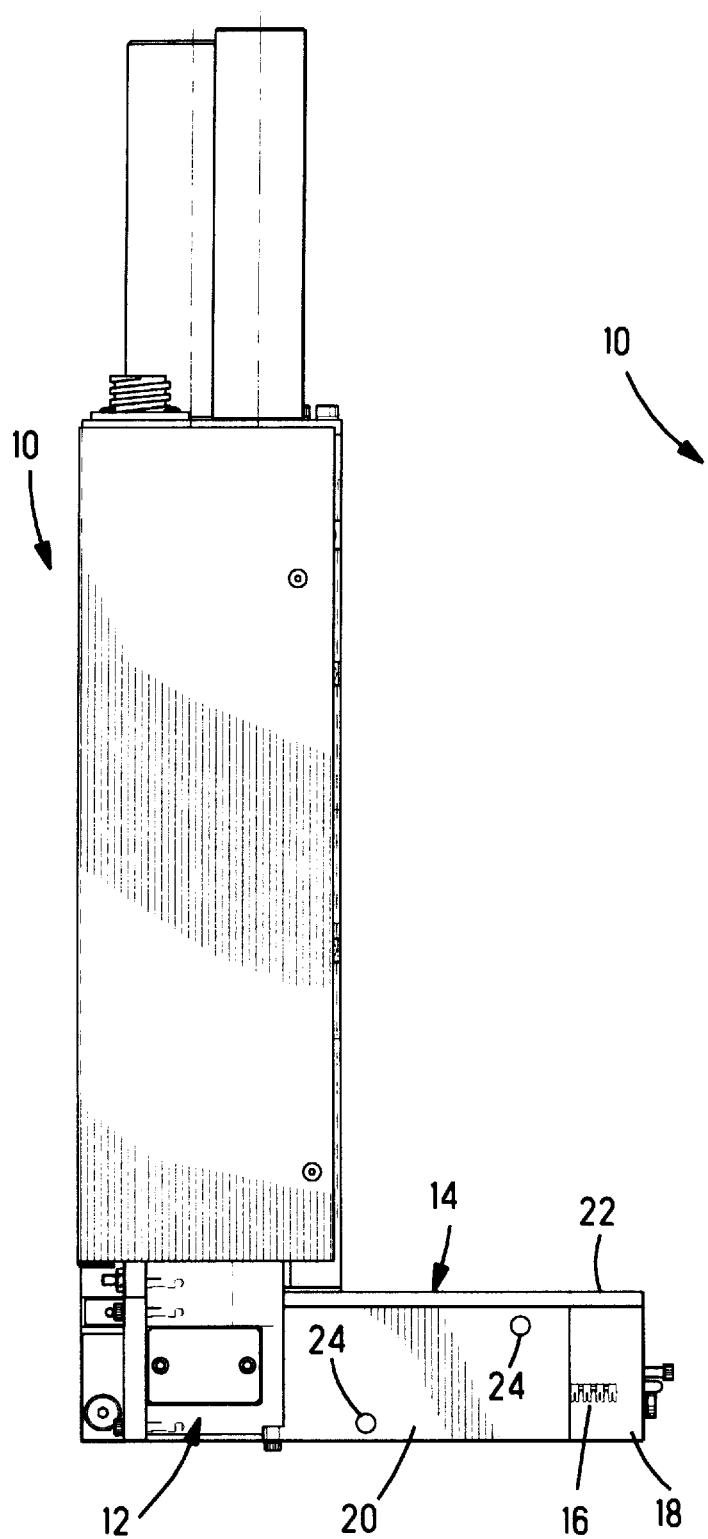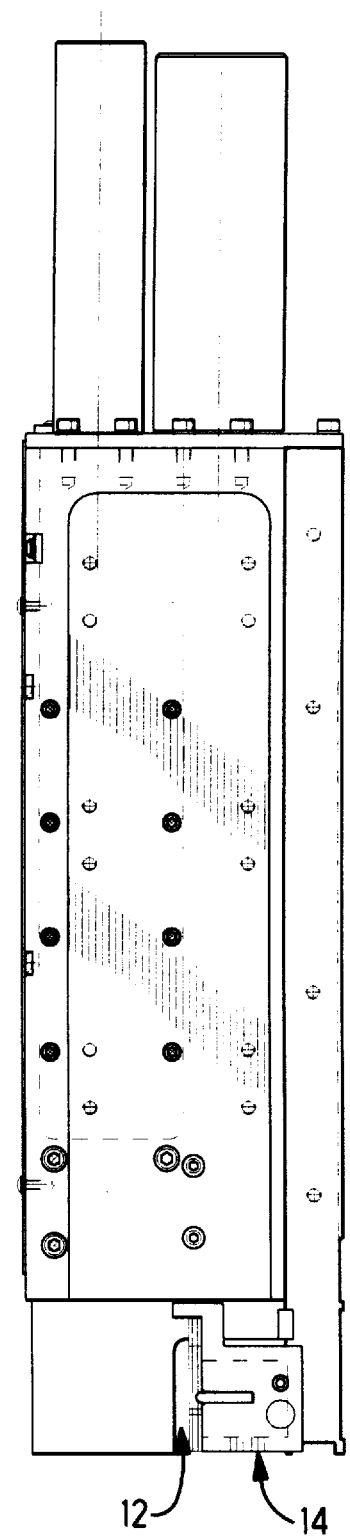
Fig. 1
Fig. 2

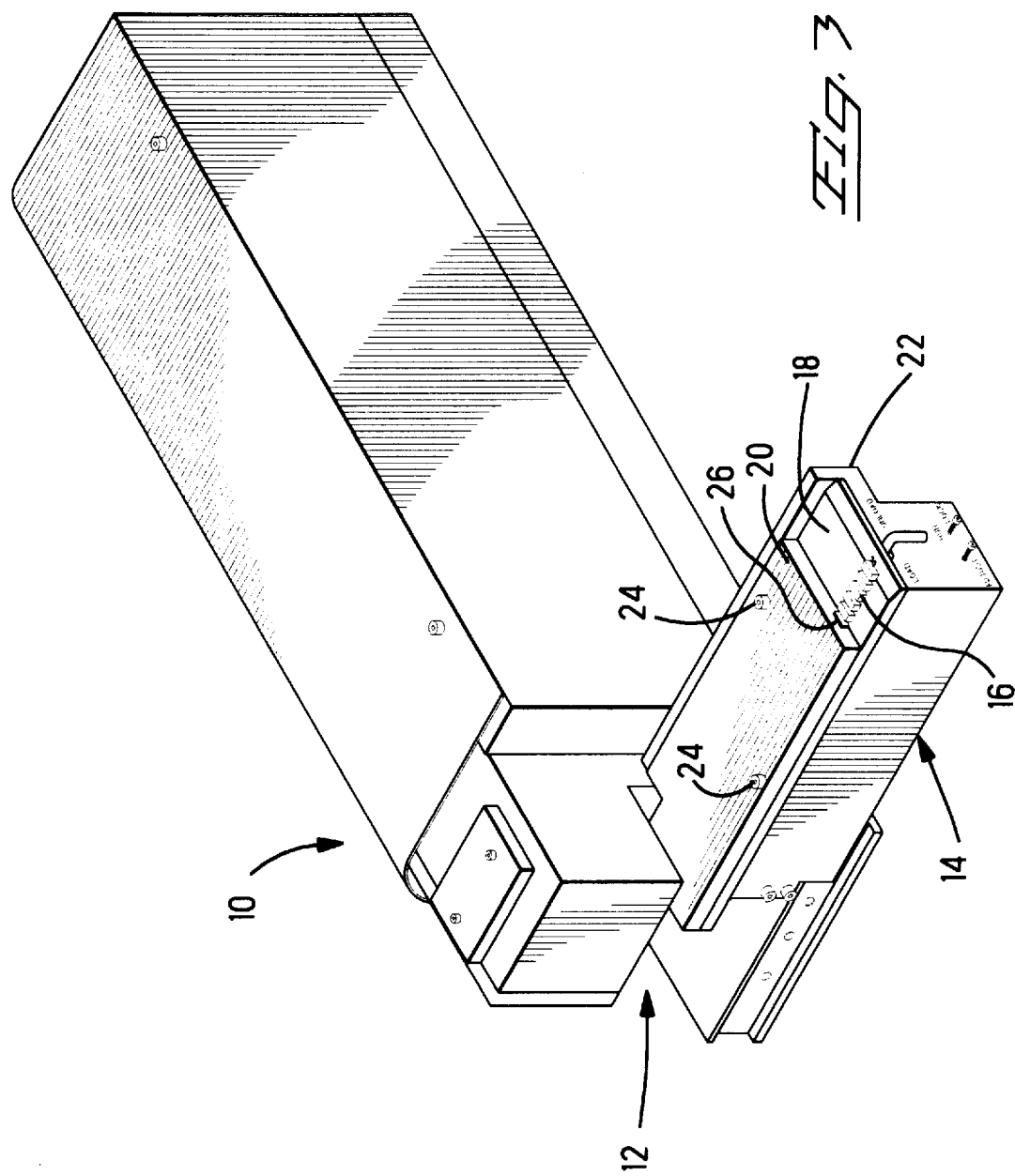

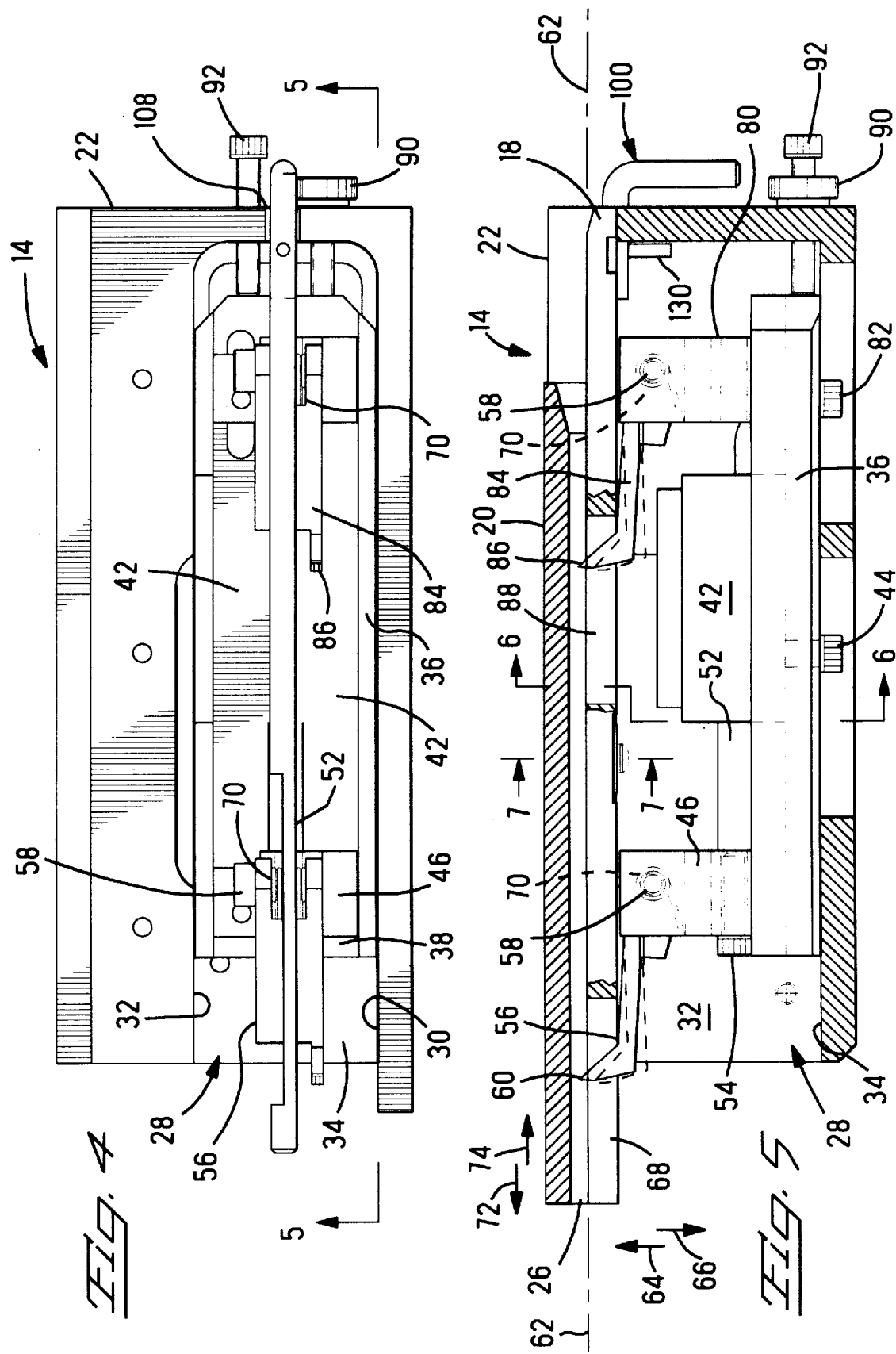

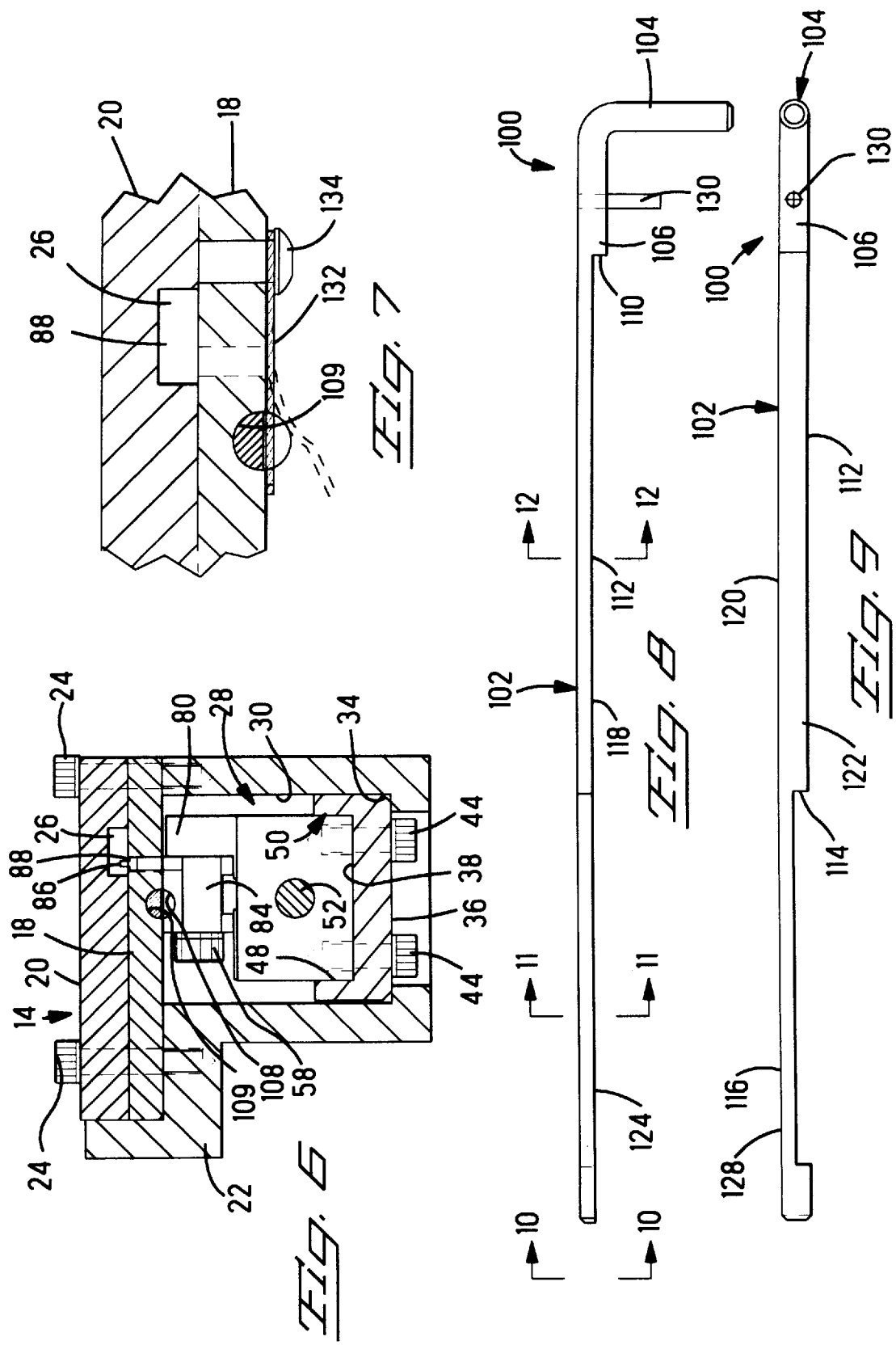

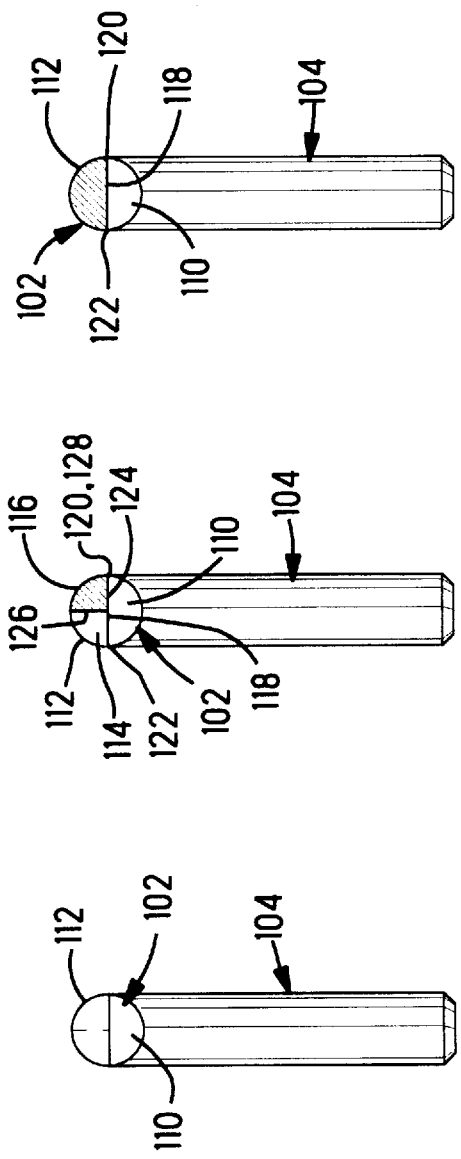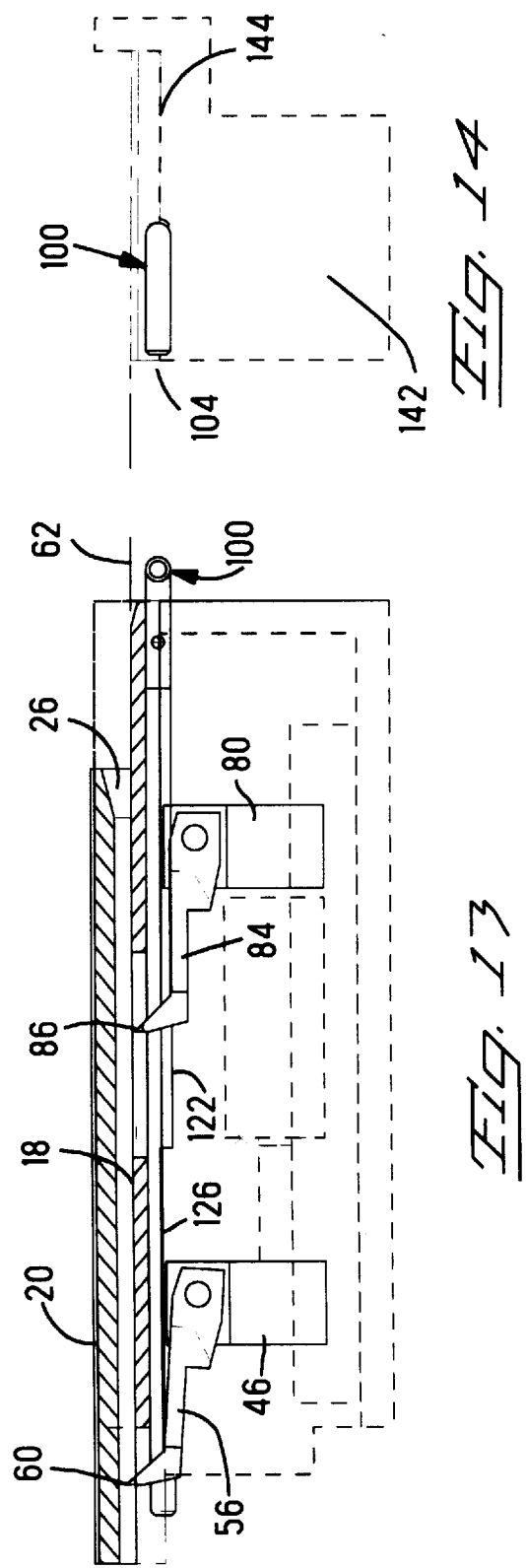

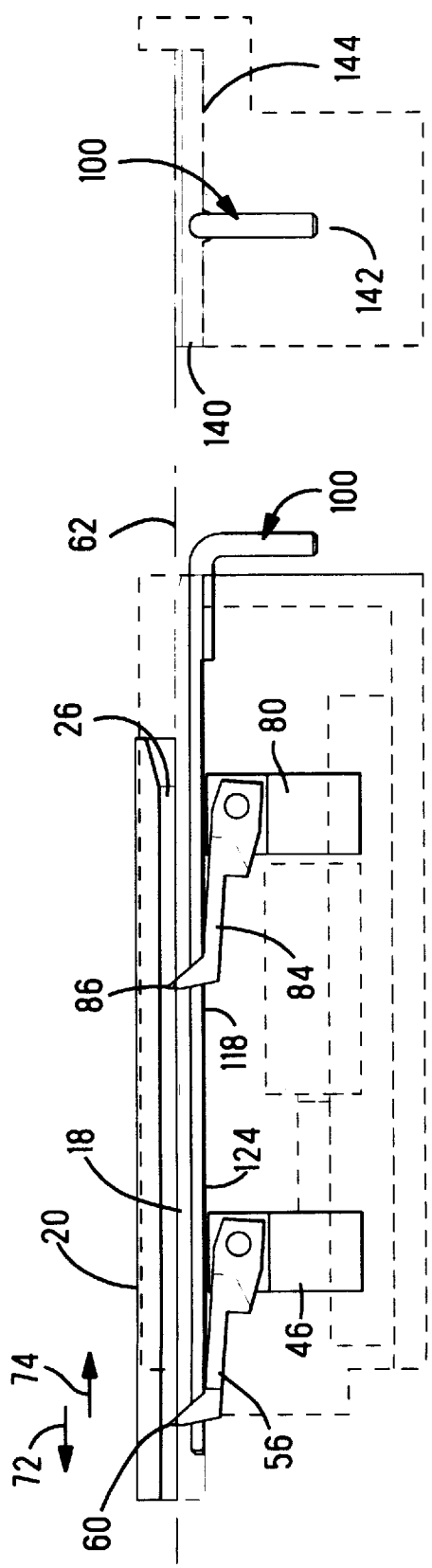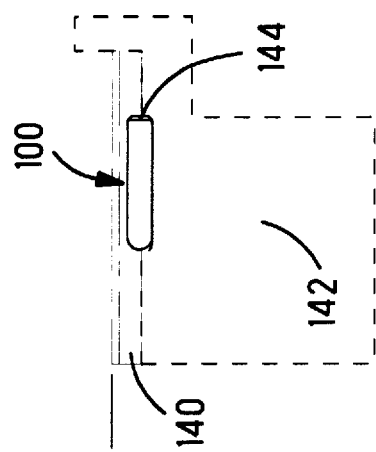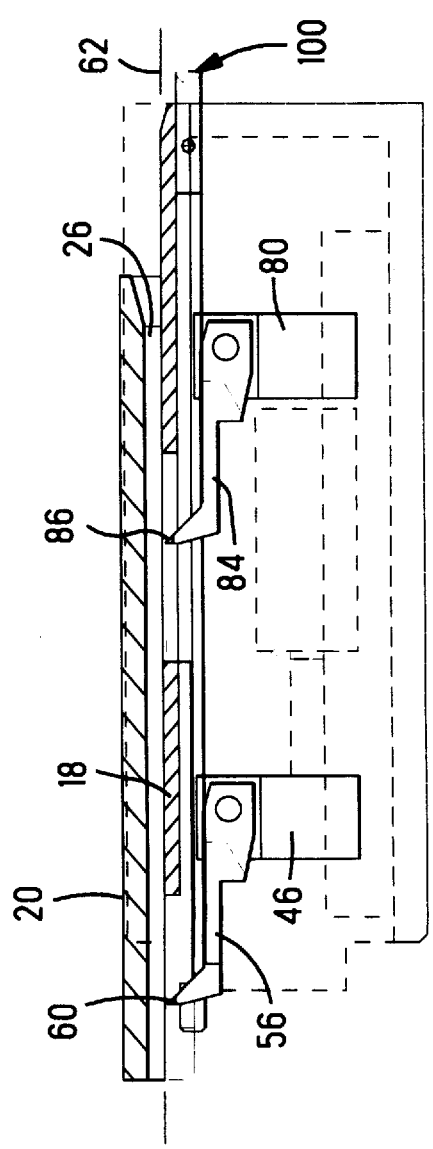

FEED RELEASE MECHANISM FOR A TERMINAL INSERTION MACHINE

The present invention relates to a terminal feed mechanism for a terminal insertion machine and more particularly to a release mechanism for disengaging feed and anti-backup members during loading and unloading of a strip of terminals.

BACKGROUND OF THE INVENTION

Terminal strip feed mechanisms for terminal insertion machines usually include a feed finger that engages a strip of terminals and, under the operation of an actuator, advances the strip to bring the next terminal into position in a workstation for inserting the terminal into a plastic housing. During operation of the machine, the feed finger, on its return stroke, may tend to cause the strip of terminals to backup along the feed track so that the terminal in the workstation becomes misaligned. To prevent this, an anti-backup finger or friction drag mechanism is usually arranged to engage the strip of terminals and allow movement of the strip in the direction of feed only. When loading a fresh strip of terminals into the machine the operator must disable the anti-backup finger, insert the strip until it is picked up by the feed finger, and then enable the anti-backup finger again for normal operation of the machine. When it is desired to remove a strip of terminals from the machine, both the feed finger and the anti-backup finger must be disabled so that the strip can be pulled out of the machine in a direction opposite that of the feed direction. This usually takes a certain amount of dexterity on the operator's part, requiring the use of both hands, and is sometimes quite inconvenient.

What is needed is a terminal strip feed device having a release mechanism that will engage and disengage both the feed finger and the anti-backup finger, as needed to load or remove a strip of terminals, that is operable by the operator using a single hand. Additionally, the release mechanism should be relatively simple to use and inexpensive to manufacture and maintain.

SUMMARY OF THE INVENTION

A terminal insertion machine having tooling in a workstation is arranged for inserting terminals into a connector housing. The terminal insertion machine includes a terminal strip feeding mechanism for feeding a strip of terminals in a first direction along a feed path into the workstation. The feeding mechanism has a feed finger arranged to move into feeding position adjacent the feed path for feeding the strip of terminals in the first direction and to move out of the feeding position away from the feed path. An anti-backup finger is arranged to move into anti-backup position adjacent the feed path for preventing movement of the strip of terminals in a second direction opposite the first direction, and to move out of the anti-backup position away from the feed path. A release member is in operative engagement with both the feed finger and the anti-backup finger and is moveable to first, second, and third positions. The release member is arranged so that when moved into the first position the feed finger is moved into the feeding position and the anti-backup finger is moved out of the anti-backup position. When moved into the second position the feed finger is moved into the feeding position and the anti-backup finger is moved into the anti-backup position. And when moved into the third position the feed finger is moved out of the feeding position and the anti-backup finger is moved out of the anti-backup position.

DESCRIPTION OF THE FIGURES

FIGS. 1 and 2 are plan and side views, respectively, of a terminal insertion machine incorporating the teachings of the present invention;

FIG. 3 is an isometric view of the terminal insertion machine shown in FIG. 1;

FIG. 4 is a plan view of the feed mechanism, shown in FIG. 1, with the guide plates removed;

FIG. 5 is a cross-sectional view taken along the lines 5—5 in FIG. 4;

FIG. 6 is a cross-sectional view taken along the lines 6—6 in FIG. 5;

FIG. 7 is a cross-sectional view taken along the lines 7—7 in FIG. 5;

FIGS. 8 and 9 are side and bottom views, respectively, of the release member shown in FIG. 4;

FIGS. 10, 11, and 12 are cross-sectional views taken along the lines 10—10, 11—11, and 12—12, respectively, in FIG. 8; and FIGS. 13 through 18 are schematic representations of the release member shown in various operating positions.

DESCRIPTION OF THE PREFERRED EMBODIMENT

There is shown in FIGS. 1, 2, and 3 a terminal insertion machine 10 having a workstation 12 containing shearing and insertion tooling, not shown. A feed unit 14 is arranged to feed a strip 16 of terminals into the workstation for shearing each terminal from the carrier strip and inserting it into a plastic housing. The feed unit has lower and upper guide plates 18 and 20, respectively, attached to a frame 22 by means of screws 24 that extend through clearance holes in the two guide plates and into threaded holes in the frame. The upper guide plate 20 includes a groove 26, as best seen in FIGS. 5 and 6, for receiving and guiding the strip 16 of terminals, in the usual manner.

The frame 22 of the feed unit 14, as best seen in FIGS. 4, 5, and 6, includes a cavity 28 having two opposing walls 30 and 32 and a floor 34. A U-shaped slide member 36 is in sliding engagement with the two walls 30 and 32 and the floor 34. An air cylinder 42 is secured to a floor 38 of the U-shaped slide member 36 by means of screws 44 that extend through clearance holes in the slide member and into threaded holes in the casing of the air cylinder. A feed finger holder 46 is in sliding engagement with the floor 38 and the two walls 48 and 50 of the U-shaped slide member. The air cylinder 42 has a piston rod 52 that is attached to the feed finger holder 46 by means of a screw 54, as best seen in FIG. 5, that extends through a clearance hole in the holder and into a threaded hole in the end of the piston rod. A feed finger 56 is pivotally attached to the feed finger holder 46 by means of a shoulder screw 58. The feed finger 56 includes a feed tip 60 for intermittently engaging the strip 16 of terminals when feeding the strip along a feed path 62, as shown in FIG. 5. The feed finger 56 can pivot in an upward direction 64 to its feeding position, shown in solid lines in FIG. 5, where the feed tip 60 intersects the feed path 62 and in a downward direction 66 out of feeding position, shown in phantom lines, where the feed tip is away from the feed path 62. The lower guide plate 16 includes a narrow slit 68 through which the feed finger tip 60 extends. A torsion spring 70 is arranged about the shoulder screw 58 so that the feed finger 56 is urged to pivot upwardly into its feeding position. By actuating the air cylinder 42 to extend or retract the piston rod 52, the feed finger 56 can be made to move in a first direction 72 toward the left for feeding the strip 16, as viewed in FIG. 5, and in a second opposite direction 74 toward the right for returning to its starting position to engaged the next terminal on the strip, in the usual manner.

An anti-backup finger holder 80 is secured to the floor 38 of the slide member 36 by means of a screw 82 the extends through a clearance slot in the slide member and into a threaded hole in the bottom of the holder, as best seen in FIG. 5. The position of the holder 80 with respect to the feed finger 56 can be selectively altered by loosening the screw 82, positioning the holder as desired, and then again tightening the screw. An anti-backup finger 84 is pivotally attached to the anti-backup finger holder 80 by means of a shoulder screw 58. The anti-backup finger 84 includes an anti-backup tip 86 that intermittently engages the strip 16 of terminals for holding the strip in position while the feed finger is undergoing its return stroke in a second direction 74, as indicated by the arrow in FIG. 5. The anti-backup finger 84 can pivot in an upward direction 64 to its anti-backup position, shown in solid lines in FIG. 5, where the anti-backup tip 86 intersects the feed path 62 and in a downward direction 66 out of anti-backup position, shown in phantom lines, where the anti-backup tip is away from the feed path 62. The lower guide plate 16 includes a narrow slit 88 through which the anti-backup finger tip 86 extends. A torsion spring 70 is arranged about the shoulder screw 58 so that the anti-backup finger 84 is urged to pivot upwardly into its anti-backup position. A first thumb screw 90 extends through a clearance hole in the end of the frame 22 and into a threaded hole in the end of the slide member 36. By turning the first thumb screw 90 in one direction the slide member 36 is made to move toward the right, as viewed in FIG. 5, and by turning the thumb screw in the opposite direction the slide member is free to move toward the left. A locking screw 92 extends through a threaded hole in the frame 22 and into abutting engagement with the end of the slide member 36. The locking screw 92 is adjusted to urge the slide member toward the left, as viewed in FIG. 5, until the head of the first thumb screw 90 engages the frame 22, thereby securing the slide member 36 in its currently adjusted position. By appropriate adjustments of the first and locking screws, the slide member 36 can be selectively positioned with respect to the frame 22.

A release member 100 is coupled to the feed finger 56 and the anti-backup finger 84, as shown in FIGS. 4 and 5, for manually engaging and disengaging these fingers when loading and unloading the strip 16 of terminals. The release member 100, as best seen in FIGS. 8 through 12, includes an elongated portion 102 and a turned down handle 104. A cylindrical-shaped shank 106, adjacent the handle 104, has its lower portion riding in a U-shaped opening 108 formed in the right end of the frame 22, as shown in Figure, while the upper portions of the shank 106 and the elongated portion 102 ride in another U-shaped opening 109 formed in the lower guide plate 68 This permits pivoting of the release member 100 within the opening 108 by simply moving the handle 104 in one direction or the other. The remainder of the elongated portion 102 includes a first cutout 110 formed along the longitudinal axis of the cylinder thereby forming a half cylinder portion 112 having a cross section as shown in FIG. 12. This half cylinder portion 112 has a second cutout 114 formed therein, as best seen in FIG. 9, thereby forming a quarter cylinder portion 116 having a cross section as shown in FIG. 11. The half cylinder portion 112 includes a flat surface 118 that is coincident with the axis of the cylindrical shaped shank 106, about which the elongated portion 102 pivots. The flat surface 118 extends to the outer peripheral surface of the half cylinder thereby forming a first cam edge 120, or first cam portion, and a second cam edge 122, or second cam portion. The quarter cylinder portion 116 includes a flat surface 124 that is coplanar and continuous with the flat surface 118, and another flat surface 126 that is formed by the cutout 114 and is perpendicular to the surface 124. The surface 124 also extends to the outer peripheral surface of the half cylinder thereby forming a third cam edge 128, or third cam portion, that is in alignment and continuous with the first cam edge 120. A pin 130 extends from a hole formed in the shank 106 and is positioned adjacent the inside wall of the right most end of the frame 22 to retain the release member 100 in position within the openings 108 and 109. A leaf spring 132 is attached to the under side of the lower guide plate 68 by means of a screw 134 that is threaded into a hole in the plate. The leaf spring is positioned so that it extends across the u-shape opening 109 and engages the flat surface 118, thereby urging the elongated portion 102 upwardly and into the U-shaped opening 109, as best seen in FIG. 7.

The release member 100 can be pivoted within the U-shaped openings 108 and 109, to first, second, and third positions 140, 142, and 144 shown in FIGS. 14, 16, and 18, respectively. The leaf spring 132 serves as a detent to urge the release member 100 to remain in each of these three positions once placed there by an operator. When pivoted into the first and third positions the cam edges 120 and 122, respectively, deflect the leaf spring to the position shown in phantom lines in FIG. 7, and when placed in the second position 142, as shown in FIGS. 5 and 16, the leaf spring is against the flat surface 118.

The operation of the feed unit 14 will now be described with reference to FIGS. 13 through 18, The release member 100 is first moved to its first position 140, shown in FIGS. 13 and 14. In this position the flat surface 126 of the quarter cylinder portion 116 is adjacent the upper surface of the feed finger 56 and the feed finger is urged to pivot upwardly by the torsion spring 70 into engagement with the flat surface. The feed finger tip 60 is now in its feeding position to engage the strip 16 of terminals for feeding the strip along the feed path 62. The second cam edge 122 of the half cylinder portion 112 is in engagement with the anti-backup finger 84, thereby holding it down, against the urging of the torsion spring 70, so that the tip 86 is out of anti-backup position below the feed path 62. With the release member 100 in this first position, the strip 16 of terminals can now be inserted into the insertion machine 10 by sliding the strip into the groove 26 along the feed path until the first terminal engages the feed finger tip 60, causing it to pivot downwardly against the urging of the torsion spring 70 as the first terminal is moved past the tip. The tip 60 then pivots upwardly with a noticeable snapping action that the operator can feel and can hear. The release member 100 is now moved to its second position 142, as shown in FIGS. 15 and 16. In this position, the flat surface 124 of the quarter cylinder portion 116 is adjacent the upper surface of the feed finger 56 so that the feed finger, as before, is urged to pivot upwardly by the torsion spring 70 into engagement with the flat surface so that the feed finger tip 60 remains in its feeding position. The flat surface 118 of the half cylinder portion 112 is now in engagement with the anti-backup finger 84, so that the anti-backup finger 84 is urged to pivot upwardly by the torsion spring 70 into engagement with the flat surface 118 so that the anti-backup finger tip 86 is pivoted into its anti-backup position, as shown in FIG. 15. With the release member 100 in this second position, the terminal insertion machine can be operated to insert terminals into plastic connector housings. During such operation the feed unit 14, upon operation of the air cylinder 42 will periodically move the feed finger in the direction 72 to advance the strip 16 of terminals toward the workstation 12 in the usual manner. With reference to FIG. 5, it should be noted that the starting position of the feed finger tip can be precisely adjusted by loosening the locking screw 92, adjusting the thumbscrew 90 as desired, and then tightening the locking screw 92. It will be noted that this adjustment is made without changing the position of the anti-backup finger with respect to the feed finger thereby eliminating the need to readjust the anti-backup finger as is required in prior art machines. When the piston rod 52 is retracted by the air cylinder 42 to retract the feed finger 56, the anti-backup finger 84 remains engaged with the strip 16 and prevents the strip from moving backward in the direction 74, as viewed in FIG. 5. When it is desired to remove the strip 16 of terminals from the terminal insertion machine, the release member 100 is pivoted to its third position 144, shown in FIGS. 17 and 18. As the release member 100 is pivoted into the third position the feed finger is moved out of feeding position and the anti-backup finger is moved out of anti-backup position so that the strip can be removed from the insertion machine 10. In this third position, the third cam edge 128 of the quarter cylinder portion 116 engages and holds the feed finger 56 down, against the urging of the torsion spring 70, so that it is out of feed position below the feed path 62. Similarly, the first cam edge 120 of the half cylinder portion 112 engages and holds the anti-backup finger 84 down, against the urging of the torsion spring 70, so that the anti-backup finger is out of anti-backup position below the feed path 62.

While the release member 100 includes structural elements described as a quarter cylinder portion and a half cylinder portion extending from a cylindrical shaped shank, it will be understood that this structure is by way of example only. Other suitable structural shapes that provide first, second, and third cam surfaces or edges that operate to move the feed and anti-backup fingers in a manner similar to the first, second, and third cam edges 102, 122, and 128, are considered to be within the scope and spirit of the following claims. And the feed finger and anti-backup finger, while described above as undergoing pivotal motions, can instead undergo linear or other motions. Further, it will be understood that the release member of the present invention can be used in other terminal handling machine such as terminal applicators.

An important advantage of the present invention is that a single release member engages and disengages both the feed finger and the anti-backup finger, as needed to load or remove a strip of terminals. The single release member is operable by the operator using only one hand. Additionally, the release mechanism is relatively simple to use and inexpensive to manufacture and maintain. When the release member is in its second position during operation of the terminal insertion machine, the leaf spring detent is effective in preventing machine vibration from inadvertently causing the release member to move to either the first or third positions, thereby preventing misfeeds and possible related damage to the terminal insertion machine or its tooling. Another important advantage of the present invention is that the position of the feed finger can be adjusted with respect to the insertion tooling without affecting the position of the anti-backup finger with respect to the feed finger.

We claim:

1. In a terminal insertion machine having tooling in a workstation for inserting terminals into a connector housing, a terminal strip feeding mechanism for feeding a strip of terminals in a first direction along a feed path into said workstation comprising:

(1) a feed finger arranged to move into feeding position adjacent said feed path for feeding said strip of terminals in said first direction and to move out of said feeding position away from said feed path;

(2) an anti-backup finger arranged to move into anti-backup position adjacent said feed path for preventing movement of said strip of terminals in a second direction opposite said first direction, and to move out of said anti-backup position away from said feed path;

(3) a release member in operative engagement with both said feed finger and said anti-backup finger and being moveable to first, second, and third positions, said release member arranged so that:

when moved into said first position said feed finger is moved into said feeding position and said anti-backup finger is moved out of said anti-backup position;

when moved into said second position said feed finger is moved into said feeding position and said anti-backup finger is moved into said anti-backup position; and when moved into said third position said feed finger is moved out of said feeding position and said anti-backup finger is moved out of said anti-backup position.

2. The feeding mechanism according to claim 1 wherein said movement of said feed finger into said feeding position and out of said feeding position is pivotal movement and said movement of said anti-backup finger into said anti-backup position and out of said anti-backup position is pivotal movement.

3. The feeding mechanism according to claim 2 including first and second holders, wherein said feed finger is pivotally attached to said first holder by means of a first pivot pin and having a first resilient member arranged to urge said feed finger to move into said feeding position.

4. The feeding mechanism according to claim 3 wherein said anti-backup finger is pivotally attached to said second holder by means of a second pivot pin and having a second resilient member arranged to urge said anti-backup finger to move into said anti-backup position.

5. The feeding mechanism according to claim 4, including a frame and a linear actuator having a stator and an armature, said stator attached to said frame and said armature attached to said first holder and arranged to move said first holder and said feed finger to effect said feeding a strip of terminals in a first direction.

6. The feeding mechanism according to claim 5 wherein said linear actuator is an air cylinder.

7. The feeding mechanism according to claim 5 wherein said release member is pivotally coupled to said frame for pivoting into said first, second, and third positions, said release member including a first cam portion arranged to move said anti-backup finger out of said anti-backup position only when said release member is moved into said third position, a second cam portion arranged to move said anti-backup finger out of said anti-backup position only when said release member is moved into said first position, and a third cam portion arranged to move said feed finger out of said feeding position only when said release member is moved into said third position.

8. The feeding mechanism according to claim 7 wherein said release member is of general cylindrical shape having an outer peripheral surface, an elongated first cutout forming an elongated first portion having first and second opposite edges terminating at said outer peripheral surface, and a second cutout forming an elongated second portion arranged contiguous with said first portion having a third edge terminating at said outer peripheral surface, wherein said first and second opposite edges are said first and second cam portions, respectively, and said third edge is said third cam portion.

9. The feeding mechanism according to claim 8 wherein said first and third edges are continuous.

10. The feeding mechanism according to claim 1 including a detent arranged to releasably hold said release member in each of said first, second, and third positions.

11. The feeding mechanism according to claim 10 wherein said detent is a resilient member having an end urged against said elongated first portion.

* * * * *